(12) United States Patent
Corrales

(10) Patent No.: US 8,587,371 B2
(45) Date of Patent: Nov. 19, 2013

(54) ELECTRIC CIRCUIT FOR REDUCING ENERGY CONSUMPTION

(76) Inventor: Andres Humberto Beltrones Corrales, Hermosillo (MX)

( * ) Notice: Subject to any disclaimer, the term of this patent is extended or adjusted under 35 U.S.C. 154(b) by 507 days.

(21) Appl. No.: 13/034,512

(22) Filed: Feb. 24, 2011

(65) Prior Publication Data

US 2011/0210716 A1     Sep. 1, 2011

Related U.S. Application Data

(60) Provisional application No. 61/308,296, filed on Feb. 25, 2010.

(51) Int. Cl.
*H03B 1/00*     (2006.01)

(52) U.S. Cl.
USPC ............ 327/551; 327/552; 327/553; 327/554

(58) Field of Classification Search
USPC ......... 327/309, 310, 311, 531, 532, 551, 552, 327/553, 554, 555; 323/369, 370; 307/116; 361/106; 363/39, 45–47
See application file for complete search history.

(56) References Cited

U.S. PATENT DOCUMENTS

| | | | | |
|---|---|---|---|---|
| 4,253,055 A | * | 2/1981 | Gatten | 323/284 |
| 7,193,404 B2 | * | 3/2007 | Weightman | 323/325 |
| 8,053,997 B2 | * | 11/2011 | Salvestrini | 315/209 CD |

* cited by examiner

*Primary Examiner* — Nguyen Tran
*Assistant Examiner* — Afework Demisse
(74) *Attorney, Agent, or Firm* — Nikia L. Gray; Quarles & Brady LLP

(57) ABSTRACT

A system and method for improving the efficiency of an electrical circuit includes an electrical circuit including a first capacitor having a first and second terminal, and a second capacitor having a first and second terminal. A first resistor is connected to the first terminal of the first capacitor and a first terminal of the second capacitor. A second resistor is connected to a second terminal of the first capacitor and the second terminal of the second capacitor. A rheostat is connected to the first terminal of the first capacitor. A Zener diode is connected to the rheostat and the second terminal of the second capacitor. In some implementations, a power source is connected across at least one of the first terminal of the first capacitor and the first terminal of the second capacitor and the second terminal of the first capacitor and the second terminal of the second capacitor.

14 Claims, 5 Drawing Sheets

| PERIOD | KHW 2008 | KHW 2009 | % ENERGY SAVINGS |
|---|---|---|---|
| FEB | 1200 | 835 | 30.42% |
| APR | 931 | 773 | 16.97% |
| JUN | 2377 | 1943 | 18.26% |
| AUG | 3752 | 3512 | 6.40% |
| OCT | 3461 | 3198 | 7.60% |
| DEC | 1872 | 1732 | 7.48% |
| AVERAGE ENERGY SAVINGS | | | 14.52% |

ELECTRIC CIRCUIT FOR REDUCING ENERGY CONSUMPTION

CROSS-REFERENCE TO RELATED APPLICATION

This application claims priority to, and the benefit of, U.S. Provisional Patent Application Ser. No. 61/308,296, filed on Feb. 25, 2010, titled "ELECTRIC CIRCUIT FOR REDUCING ENERGY CONSUMPTION," the entire contents of which are incorporated herein by reference.

BACKGROUND

In many electrical systems, energy is delivered using alternating current (AC). Most homes and buildings, for example, use AC power supplies to provide energy to various systems within the structure, such as air conditioning, heaters, refrigeration personal electronics, and lighting. As the cost of electricity generation and concerns over its associated environmental damage increases, there is a substantial interest in increasing the efficiency of electricity delivery to homes and business. Even a modest improvement in efficiency can be of significant benefit to the resident as well as the environment.

Electricity delivery systems are not perfectly efficient. In many cases, the electricity supply is dirty and may include noise or other artifacts that can cause inefficient transfer of energy from the supply to the load. The noise may be generated at the facility where the electricity is generated, during distribution, or due to anomalies in the transmission lines that carry the electricity. In most cases, power supply companies attempt to generate a clean power signal, but some amount of noise is inevitable.

An electricity supply may also include anomalies such as power spikes or picks that represent a large amount of energy delivered over a short period of time. Unlike noise, which may often be random or fuzzy, power spikes represent a severe but temporary deviation from the normal sinusoidal pattern of an AC electrical signal. Although a single spike may not be particularly destructive (though it is certainly possible), multiple spikes delivered to a machine or component over an extended period of time may cause significant damage or possibly failure of the device. Of course, in any situation where an electrical component fails, the potential for personal injury is always present.

A clean electricity supply is one that minimizes an amount of noise and other anomalies delivered to the load. Clean electricity supplies generally allow more efficient and safe operation of electronic devices and provide significant benefits to devices incorporating electric motors or that include other inductive loads. Furthermore, the additional electrical energy that would otherwise be consumed in unnecessary noise or spikes is preserved in a clean electricity supply.

In electrical systems it is possible to combine multiple electrical signals into a single signal for delivery to a load. When the multiple signals combine, they may do so constructively or destructive, referred to as either constructive or destructive interference. In an electrical system that includes noise, for example, it is possible to combine a supplementary electrical signal with a noisy power signal to cancel the noise and generate a clean power signal. In that case, the shape of the supplementary signal is selected to destructively interfere with the noise in the power signal to generate the clean signal. A similar mechanism, or one that employs capacitors to absorb additional electrical energy over short time periods may be used to combat power spikes or picks.

There is a need, therefore, for a system and method to compensate for noise, spikes, and other anomalies present in electrical energy supply signals to improve an efficiency and operation of loads driven by those electrical signals. Not only would such a system and method generate considerable cost savings and minimize damage to electrical systems, the system and method would minimize an amount of energy consumed mitigating the negative effects of power generation on the environment.

SUMMARY OF THE INVENTION

In one implementation, the present invention is a circuit comprising a first capacitor having a first and second terminal, and a second capacitor having a first and second terminal. The circuit includes a first resistor connected to the first terminal of the first capacitor and a first terminal of the second capacitor, a second resistor connected to a second terminal of the first capacitor and the second terminal of the second capacitor, and a rheostat connected to the first terminal of the first capacitor. The circuit includes a Zener diode connected to the rheostat and the second terminal of the second capacitor.

In another implementation, the present invention includes a circuit comprising a first capacitor having a first and second terminal, a second capacitor having a first and second terminal, and a first resistor connected to at least one of the first capacitor and second capacitor. The circuit includes a second resistor connected to at least one of the first capacitor and second capacitor, a rheostat connected to at least one of the first capacitor and second capacitor, and a Zener diode connected to at least one of the first capacitor and second capacitor.

In another implementation, the present invention includes a method for improving the efficiency of an electrical circuit, comprising forming an electrical circuit, by providing a first capacitor having a first and second terminal, providing a second capacitor having a first and second terminal, and connecting a first resistor to the first terminal of the first capacitor and a first terminal of the second capacitor. The circuit is formed by connecting a second resistor to a second terminal of the first capacitor and the second terminal of the second capacitor, connecting a rheostat to the first terminal of the first capacitor, and connecting a Zener diode to the rheostat and the second terminal of the second capacitor. The method includes connecting a power source across at least one of the first terminal of the first capacitor and the first terminal of the second capacitor and the second terminal of the first capacitor and the second terminal of the second capacitor.

BRIEF DESCRIPTION OF THE DRAWINGS

Implementations of the invention will become more apparent from the detailed description set forth below when taken in conjunction with the drawings, in which like elements bear like reference numerals.

DETAILED DESCRIPTION OF THE PREFERRED EMBODIMENTS

This invention is described in preferred embodiments in the following description with reference to the Figures, in which like numbers represent the same or similar elements. Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

The described features, structures, or characteristics of the invention may be combined in any suitable manner in one or more embodiments. In the following description, numerous specific details are recited to provide a thorough understanding of embodiments of the invention. One skilled in the relevant art will recognize, however, that the invention may be practiced without one or more of the specific details, or with other methods, components, materials, and so forth. In other instances, well-known structures, materials, or operations are not shown or described in detail to avoid obscuring aspects of the invention.

Applicant's invention is directed to a device that, when in electrical contact with the main circuit breaker of a building, reduces the energy consumption of that building. While Applicant's invention is described herein in reference to reducing the energy consumption of a residence, one of ordinary skill in the art will recognize that Applicant's invention is not so limited. In other embodiments, Applicant's invention may be used to reduce the energy consumption of a commercial or industrial facility. In other embodiments, Applicant's invention may be used to reduce the energy consumption of a specific device.

Applicant's invention as described herein can be used use with 220 volt monophase power. However, as one of ordinary skill in the art will appreciate, Applicant's invention is equally applicable to 110 V power or other power supplies such as multi-phase power supplies.

Figure 1A:
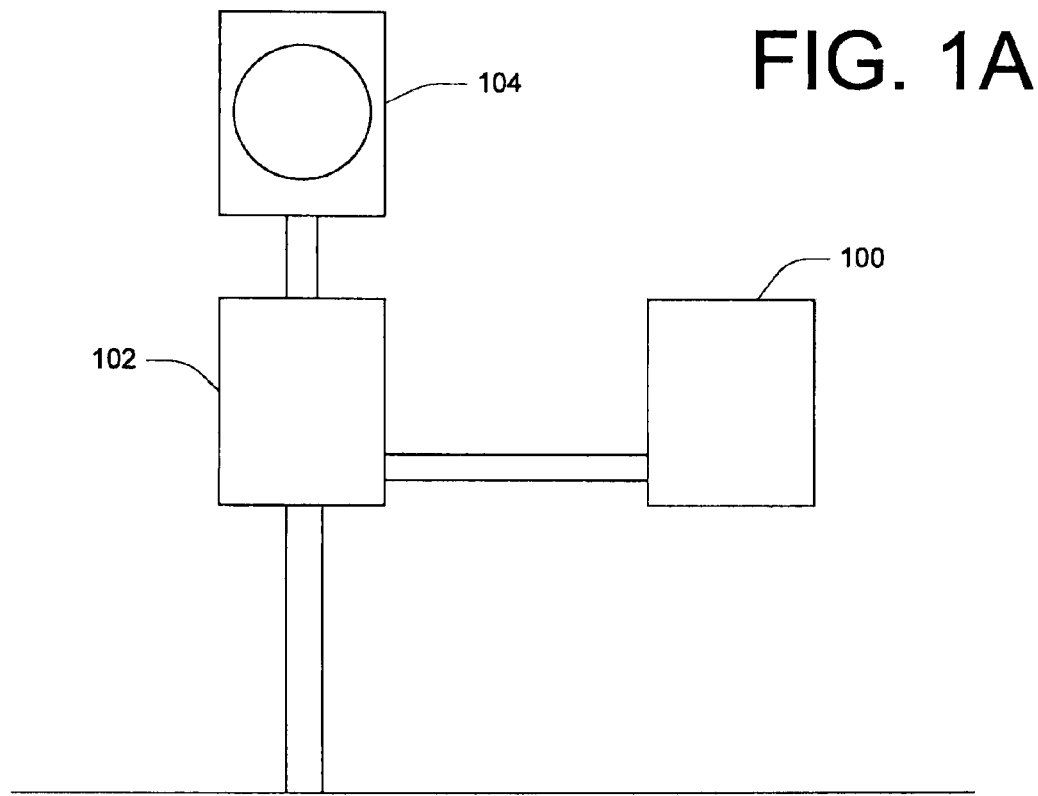
FIG. 1A is an exemplary block diagram depicting Applicant's invention connected to the main circuit breaker of a building.
Figure 1B:
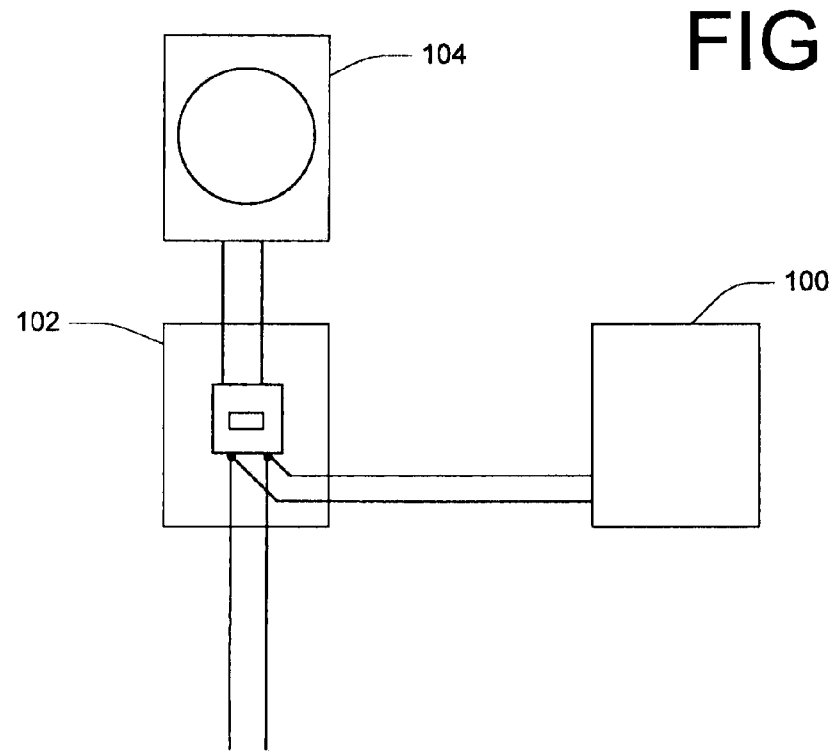
FIG. 1B is another exemplary block diagram depicting Applicant's invention connected to the main circuit breaker of a building.

Turning now to FIGS. 1A and 1B, Applicant's device 100 is depicted connected to main breaker 102 of a residence or other building. Main breaker 102 is further connected to meter 104. As will be appreciated by one of ordinary skill in the art, the main breaker is a two-pole breaker that the feeder wire from the power line connects to, providing 240 volt power to a building. In other implementations, main breaker 102 may be configured to supply a multi-phase power supply to the structure, such as a three-phase or dual-phase power supply.

Figure 2:
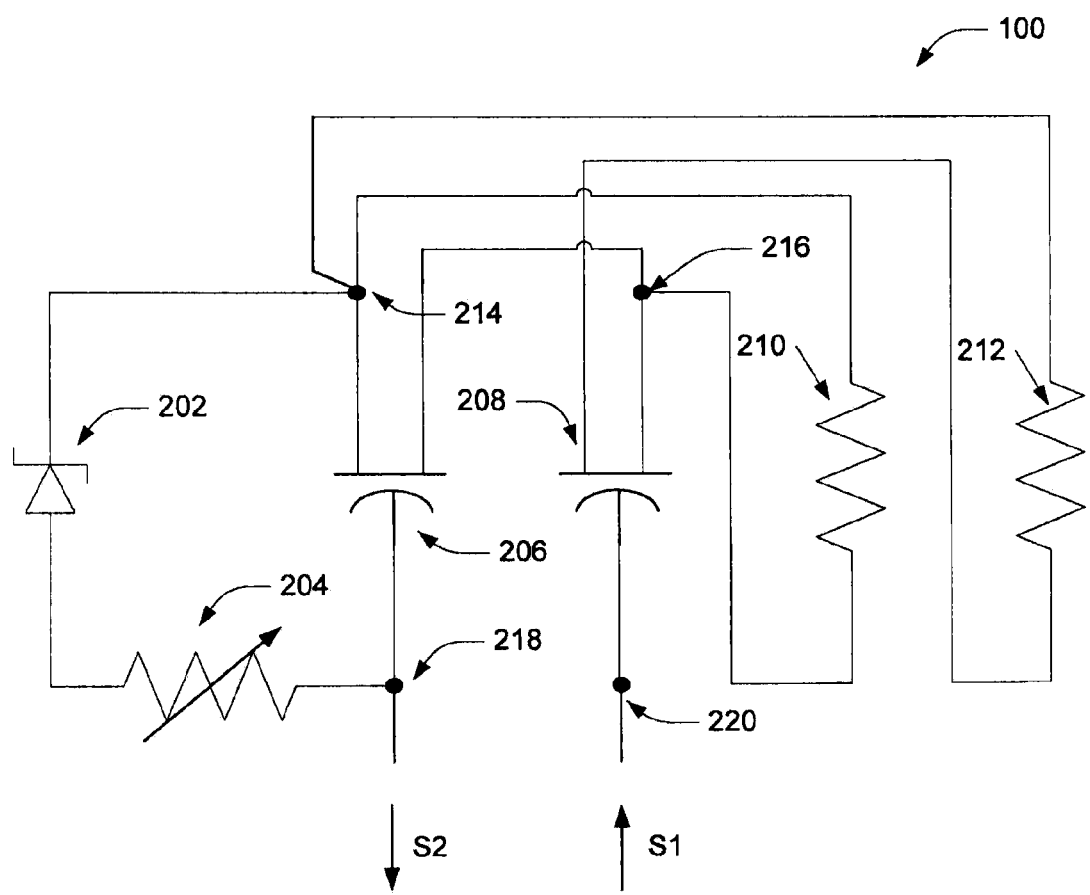
FIG. 2 is a circuit diagram depicting an embodiment of Applicant's invention.

Turning now to FIG. 2, a circuit diagram of Applicant's device 100 is presented. As can be seen in the illustrated embodiment of FIG. 2, Applicant's device 100 comprises Zener diode 202, rheostat 204, capacitors 206 and 208, and resistors 210 and 212. As will be appreciated by one of ordinary skill in the art, a Zener diode is a type of diode that permits current both in the forward direction, as with a normal diode, and in the reverse direction if the voltage is larger then the breakdown voltage, or "Zener voltage." Furthermore, a person of ordinary skill in the art will appreciate that a rheostat is a two-terminal potentiometer having a sliding contact that forms an adjustable voltage divider.

In the illustrated embodiment of FIG. 2, Applicant's circuit 100 comprises capacitor 208 whose source is connected to terminal or input 220 receiving a first current signal S1, and whose drain is connected to a second terminal 216 and resistor 212. Both resistors 210 and 212 are further connected to terminal 214, which along with terminal 216, connect to the source of capacitor 206. The drain of capacitor 206 is connected to terminal 218 which output signal S2. Terminal 214 is further connected to Zener diode 202 which further connects to rheostat 204. Finally, rheostat 204 connects to terminal 218.

In certain embodiments, resistors 210 and 212 are both 1000 megaohm resistors. In certain embodiments, capacitors 206 and 208 are both 40 MF. In certain embodiments, Zener diode 202 is 150 ohms. In certain embodiments, rheostat 204 is 1000 megaohm. When installed, rheostat 204 should be adjusted using an ammeter such that noise and electric peaks in the signal are minimized, resulting in the waveform of FIG. 3B, as discussed below.

Figure 3A:
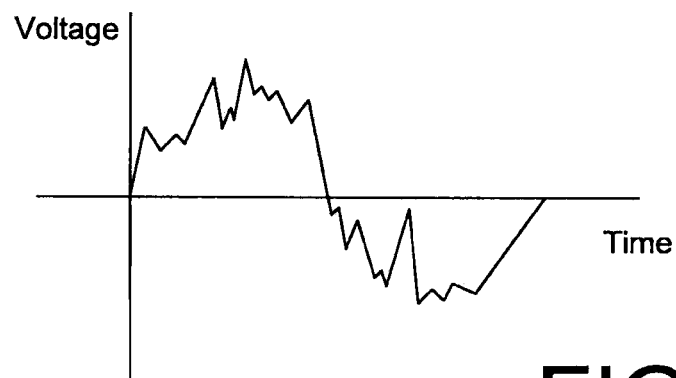
FIG. 3A is an exemplary graph depicting the waveform of a signal.
Figure 3B:
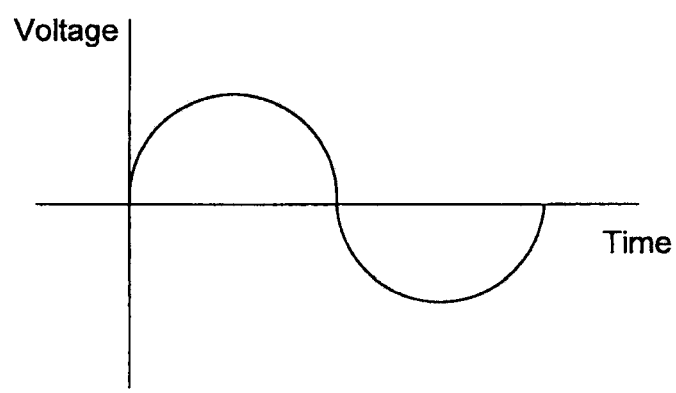
FIG. 3B is an exemplary graph depicting the waveform of a signal after the signal has passed through Applicant's invention.

As will be appreciated by one of ordinary skill in the art, Applicant's circuit 100 produces a regulated current traveling in the opposite direction of the electric current of the home or other facility in which Applicant's circuit 100 is installed. Thus, Applicant's circuit 100 can be used to filter the signal waveform by removing noise and electric peaks. FIGS. 3A and 3B illustrate this effect. A common signal waveform having noise and electric peaks is presented in FIG. 3A. After the signal is passed through Applicant's circuit 100, the waveform is smoother, as illustrated in FIG. 3B.

Figures 4A, 4B:
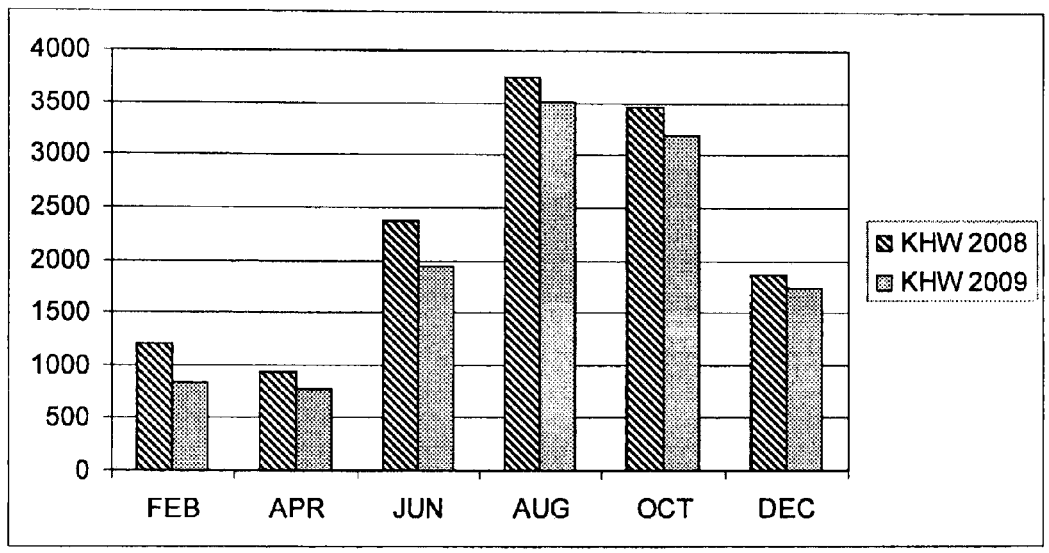
FIG. 4A is an exemplary graph depicting the energy savings over a comparative ten month period attributable to Applicant's invention.
FIG. 4B is a chart of the exemplary graph of FIG. 4A.

A smoother signal waveform results in energy savings. Applicant has evaluated the energy savings produced by installing Applicant's circuit 100 on the main circuit breaker of a residence. The results of this evaluation are depicted in FIGS. 4A and 4B. As can be seen in FIGS. 4A and 4B, over a twelve (12) month period, the residence experienced an average bi-monthly energy savings of 14.52%, with a high of 30.42% and a low of 7.48%. On an office building having a greater energy consumption, Applicant's circuit 100 resulted in an average energy savings of 35%.

Figure 5:
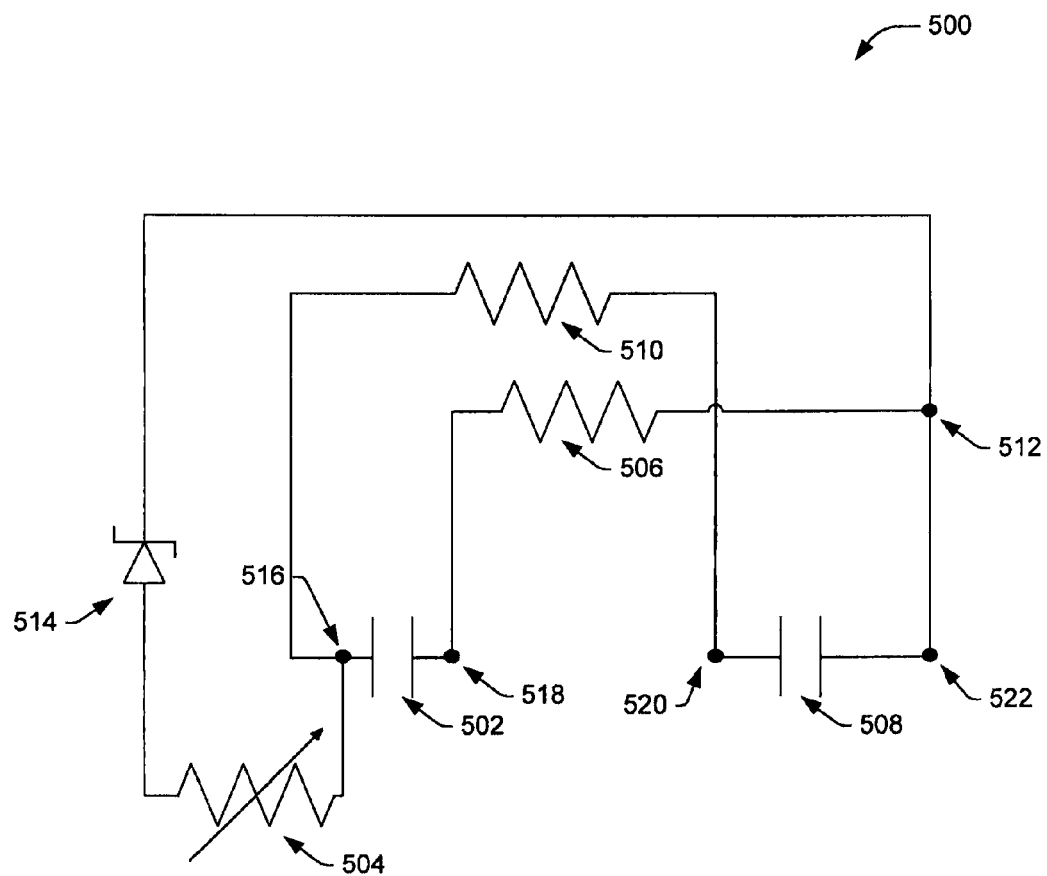
FIG. 5 is a circuit diagram showing an alternative implementation of the present system.

FIG. 5 illustrates circuit 500 depicting an alternative implementation of the present configured to connect to a two phase power supply, such as a 220V two-phase supply.

Circuit 500 includes capacitors 502 and 508. In one implementation, each of capacitors 502 and 508 has capacitances of approximately 40 microfarads. The first terminal of capacitor 502 is connected to Rheostat 504. Rheostat 504 is a variable resistor. In one implementation rheostat 504 has a variable resistance about a value of 100 ohms. Rheostat 504 may also include other kinds of variable resistors such as digital potentiometers, or other voltage divider circuitry. When installed, rheostat 504 can be adjusted using an ammeter such that noise and electric peaks in the signal are minimized.

A second terminal of capacitor 502 is connected to resistor 506. In one implementation, resistor 506 has a value of 100 ohms.

Circuit 500 also includes capacitor 508. A first terminal of capacitor 508 is connected to resistor 510. In one implementation, resistor 510 has a value of 100 ohms. A second terminal of capacitor 508 is connected to node 512 which is, in turn, connected to resistor 506 and the cathode of Zener diode 514. In one implementation, during normal operation, Zener diode 514 has a resistance of 150 ohms. Finally, an anode of Zener diode 514 is connected to Rheostat 504.

To connect circuit 500 to a two-phase power supply, four connections are made. A negative supply (e.g., ground, neutral) of the first phase is connected to circuit 500 at node 516 and a negative supply of the second phase is connected to circuit 500 at node 518. A positive supply (e.g., feed, hot wire) of the first phase is connected to circuit 500 at node 520 and a positive supply of the second phase is connected to circuit 500 at node 522.

While the preferred embodiments of the present invention have been illustrated in detail, it should be apparent that modifications and adaptations to those embodiments may occur to one skilled in the art without departing from the scope of the present invention as set forth in the following claims.

We claim:

1. A circuit comprising:
    a first capacitor having a first and second terminal;
    a second capacitor having a first and second terminal;
    a first resistor connected to the first terminal of the first capacitor and a first terminal of the second capacitor;
    a second resistor connected to a second terminal of the first capacitor and the second terminal of the second capacitor;
    a rheostat connected to the first terminal of the first capacitor; and
    a Zener diode connected to the rheostat and the second terminal of the second capacitor.

2. The circuit of claim 1, wherein a power source is connected across at least one of the first terminal of the first capacitor and the first terminal of the second capacitor and the second terminal of the first capacitor and the second terminal of the second capacitor.

3. The circuit of claim 1, wherein at least one of the first and second resistor has a resistance of 100 ohms.

4. The circuit of claim 1, wherein at least one of the first and second capacitor has a capacitance of 40 microfarads.

5. The circuit of claim 1, wherein a resistance of the rheostat is selected to minimize at least one of a noise and an electrical peak of a signal input to the circuit.

6. A circuit comprising:
    a first capacitor having a first and second terminal;
    a second capacitor having a first and second terminal;
    a first resistor connected to at least one of the first capacitor and second capacitor;
    a second resistor connected to at least one of the first capacitor and second capacitor;
    a rheostat connected to at least one of the first capacitor and second capacitor; and
    a Zener diode connected to at least one of the first capacitor and second capacitor.

7. The circuit of claim 6, wherein a power source is connected to at least one of the first capacitor and the second capacitor.

8. The circuit of claim 6, wherein at least one of the first and second resistor has a resistance of 100 ohms.

9. The circuit of claim 6, wherein at least one of the first and second capacitor has a capacitance of 40 microfarads.

10. The circuit of claim 6, wherein a resistance of the rheostat is selected to minimize at least one of a noise and an electrical peak of a signal input to the first terminal.

11. A method for improving the efficiency of an electrical circuit, comprising:
    forming an electrical circuit, by:
        providing a first capacitor having a first and second terminal;
        providing a second capacitor having a first and second terminal;
        connecting a first resistor to the first terminal of the first capacitor and a first terminal of the second capacitor;
        connecting a second resistor to a second terminal of the first capacitor and the second terminal of the second capacitor;
        connecting a rheostat to the first terminal of the first capacitor; and
        connecting a Zener diode to the rheostat and the second terminal of the second capacitor; and
    connecting a power source across at least one of the first terminal of the first capacitor and the first terminal of the second capacitor and the second terminal of the first capacitor and the second terminal of the second capacitor.

12. The method of claim 11, wherein at least one of the first and second resistor has a resistance of 100 ohms.

13. The method of claim 11, wherein at least one of the first and second capacitor has a capacitance of 40 microfarads.

14. The method of claim 11, wherein a resistance of the rheostat is selected to minimize at least one of a noise and an electrical peak of a signal input to the first terminal.

* * * * *